United States Patent [19]

Infante

[11] 4,074,147
[45] Feb. 14, 1978

[54] SWITCHING AMPLIFIERS

[75] Inventor: Carlo Infante, Dallas, Tex.

[73] Assignee: Xerox Corporation, Stamford, Conn.

[21] Appl. No.: 747,161

[22] Filed: Dec. 3, 1976

[51] Int. Cl.$^2$ ............................................. H03K 1/02
[52] U.S. Cl. ................................. 307/230; 307/237;
307/241; 307/246; 307/254; 307/296 A;
358/190
[58] Field of Search ............... 307/296, 230, 237, 241,
307/254, 246; 358/190

[56] References Cited

U.S. PATENT DOCUMENTS

| | | | |
|---|---|---|---|
| 3,609,385 | 9/1971 | Berwin | 307/296 X |
| 3,800,166 | 3/1974 | Keiner | 307/296 X |
| 3,919,568 | 11/1975 | Minner | 307/296 |
| 3,930,170 | 12/1975 | Burens et al. | 307/254 |

Primary Examiner—John S. Heyman

[57] ABSTRACT

Picture quality in a cathode ray tube image display system is improved by a switching amplifier providing output pulses with fast rise and fall times. First and second switching signals are applied as base drive voltages to first and second transistorized differential amplifiers having one transistor of each amplifier with a common collector electrode connection. The interconnection of the collector electrodes forms a summing junction coupled to an output transistor connected in a common base configuration. In series with the output transistor and a power supply is a load resistor that, in conjunction with the output transistor, establishes an output voltage dependent on the sum of the currents generated by the first and second differential amplifiers. Also connected to the output transistor is a clamping network comprising a diode biased at a first voltage level that is lower than the voltage level of the power supply connected to the load resistor. The clamping network limits the voltage level of the output pulses applied to the cathode ray tube. Coupled to the second differential amplifier is a differentiator that generates a current spike that is summed at the summing junction with the currents of the first and second differential amplifiers.

20 Claims, 4 Drawing Figures

4,074,147

SWITCHING AMPLIFIERS

BACKGROUND OF THE INVENTION

This invention relates to a switching amplifier and more particularly to a switching amplifier with output pulses having fast times and fall times.

In addition to the well known home television receiver, cathode ray tube displays are being used with increasing frequency for presenting visual images of alpha-numeric information.

To develop an image on a cathode ray tube an electron beam is scanned across the face of the tube in a pattern known as a raster scan. One of the key parameters that determines the quality of the image is called resolution, and resolution is dependent on two characteristics of the display. One of these characteristics is the size of the electron beam and the other, which is not so apparent, is the switching speed of the amplifier driving the electron gun generating the beam.

The compromise between picture quality and amplifier speed is well-known. It is more customarily stated in terms of amplifier or video bandwidth as fully discussed by V. K. Zworkykim and G. A. Morton, in their work entitled "Television," 2nd ed. John Wiley, 1954, pages 171–212. For displays of computer-generated text, such as alpha-numerics or graphics, a more convenient parameter is video risetime. For a linear or non-switching amplifier, bandwidth ($BW$) and risetime ($t_R$) are related by the well-known equation:

$$BW \times t_R = 0.35$$

For a full discussion of this equation reference is made to the work of E. M. Cherry and D. E. Hopper entitled "Amplifying Devices and Low-Pass Amplifier Design," John Wiley, 1968, page 656. In conventional television the bandwidth requirement has been a major limitation due to FCC regulations on frequency spectrum uses. In computer displays the availability and cost of high speed amplifiers has been the limiting factor.

SUMMARY OF THE INVENTION

In accordance with the present invention, there is provided a switching amplifier generating output pulses having improved rise and fall times.

In accordance with the present invention, a switching amplifier generates output pulses wherein the rise time of one edge of the generated output pulses is controlled by clamping the amplifier output at a first level below the level of a voltage supply. The fall time of the other edge of each output pulse is controlled by a current surge impressed upon the normal current output of the amplifier.

BRIEF DESCRIPTION OF THE DRAWING

A more complete understanding of the invention and its advantages will be apparent from the specification and claims and from the accompanying drawings illustrative of the invention.

Referring to the drawings.

DESCRIPTION OF THE PREFERRED EMBODIMENT

Figure 1:
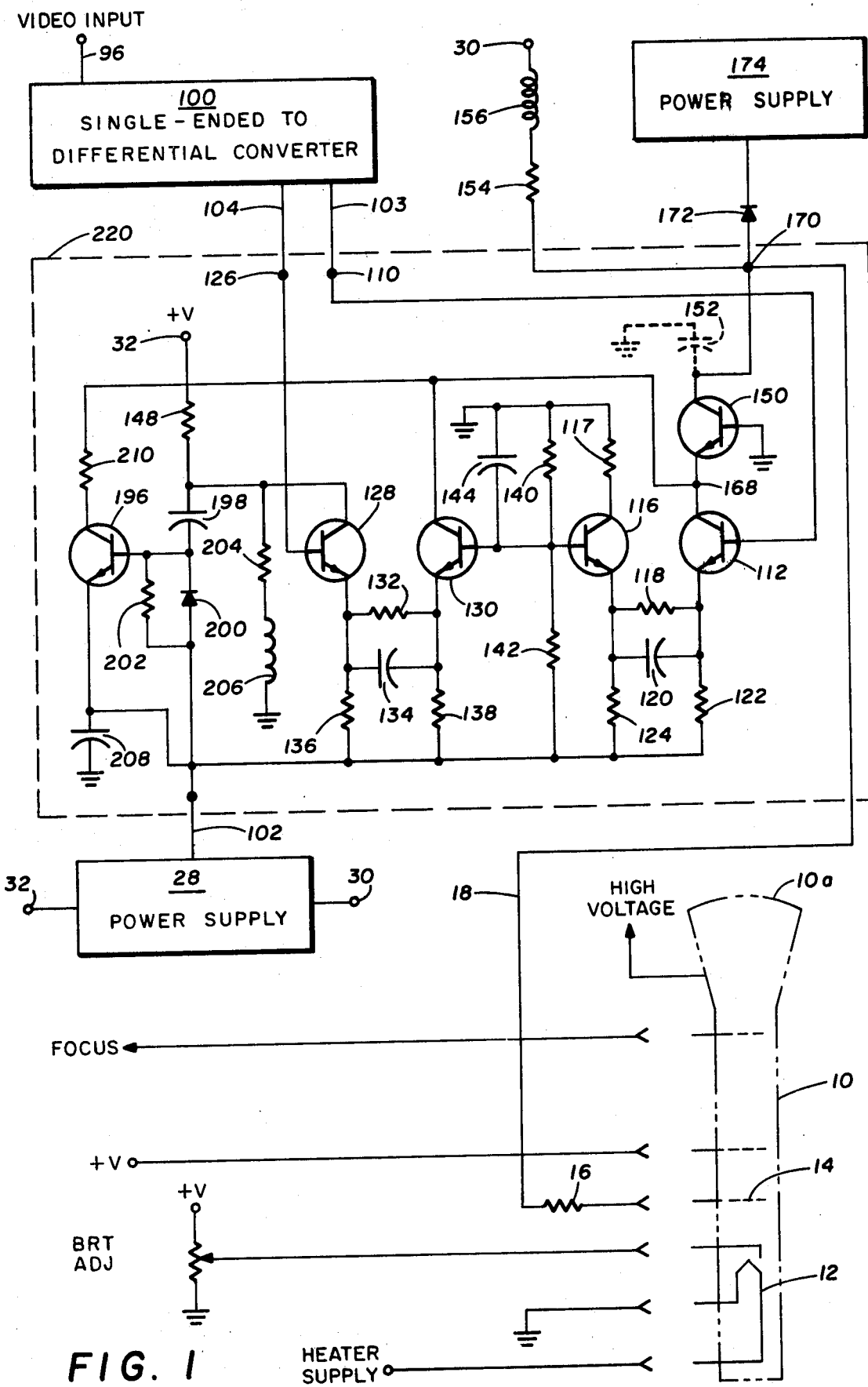
FIG. 1 is a schematic of a cathode ray tube image display system incorporating the switching amplifier of the present invention.

Referring to FIG. 1, this illustrates a display system incorporating an image display device 10, herein illustrated as a cathode ray tube, having deflecting means for writing on a screen 10a. In the display device illustrated, the deflecting means comprises an electron beam that impinges on the screen 10a from an electron gun 12 as controlled by a grid 14 receiving voltage pulses at a resistor 16 connected to a line 18.

At the lower left-hand portion of FIG. 1 there is illustrated a power supply 28 for providing filtered DC voltages at various levels for driving the system components. The power supply 28 also includes circuitry for generating other voltage levels at terminals 30 and 32 to the switching amplifier of the present invention.

To generate an image on the screen 10a of the cathode ray tube 10, a video input signal is applied to a line 96 to a single-ended to differential converter 100. The converter 100 generates on the lines 103 and 104 voltage pulses of opposite polarity.

Figure 2:
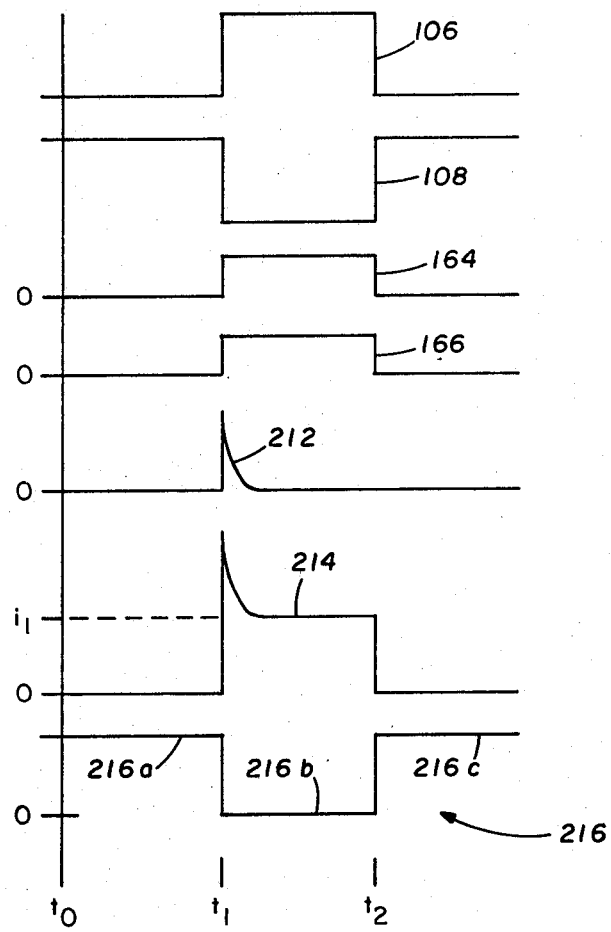
FIG. 2 is a series of wave forms illustrating voltage and current levels generated in the switching amplifier of FIG. 1.

Referring to FIG. 1, on the line 103 at the terminal 110 there is generated a pulse such as indicated by the voltage pulse 106 (FIG. 2). On the line 104 at the terminal 126 there is generated a pulse of opposite polarity from the pulse 106, such as the voltage pulse 108 (FIG. 2). Each of the voltage pulses 106 and 108 has a leading edge at time $t_1$ and a trailing edge at time $t_2$ occurring some fixed interval of time after $t_o$.

The voltage pulse 106 as appearing at the terminal 110 is applied to the base electrode of a transistor 112. The transistor 112 is one-half of a first differential amplifier including a transistor 116 having an emitter electrode interconnected to the emitter electrode of the transistor 112 through a resistor 118 in parallel with a capacitor 120. Resistors 122 and 124 are also connected to the emitter electrode of the transistors 112 and 116, respectively, and to the DC voltage on a line 102.

The voltage pulse 108 as appearing at the terminal 126 is applied to the base electrode of a transistor 128. The transistor 128 is one-half of a second differential amplifier including a transistor 130. Emitter electrodes of the transistors 128 and 130 are interconnected through a resistor 132 in parallel with a capacitor 134. Resistors 136 and 138 are interconnected to the line 102 and to the emitter electrode of transistors 128 and 130, respectively.

Circuitry common to the first differential amplifier of transistors 112 and 116 and the second differential amplifier of transistors 128 and 130 consists of a resistance divider of resistors 140 and 142, the former in parallel with a capacitor 144. The resistors 140 and 142 establish the reference base bias applied to the transistors 116 and 130 of the first and second differential amplifiers.

Interconnected to the collector electrode of the transistors 112 and 130 is an output transistor 150 in a common base configuration. At the collector electrode of the transistor 150 there is connected a load resistor 154. In series with the resistors 154, as part of the collector circuit for the transistor 150, is an inductor 156, the latter connected by means of a terminal 30 to the power supply 28.

For the second differential amplifier, the collector circuit for the transistor 128 includes a resistor 148, connected to a terminal 32, and a resistor 204 in series with an inductor 206.

In operation of the first and second differential amplifiers, applying the voltage pulse 106 to the transistor 112 turns on the transistor 112 and a current flows to the transistor 150 from the voltage source at the terminal 30 through the resistor 154. This produces a current pulse, as illustrated in FIG. 2 by the waveform 164, through the transistor 112. Similarly, applying the voltage pulse 108 to the base electrode of the transistor 128 turns on transistor 130 of the second differential amplifier thereby contributing to the current flow through the transistor 150, again from the voltage at the terminal 30 through the resistor 154. This component (current through transistor 130) of the total current is illustrated by the waveform 166 of FIG. 2.

By the independent operation of the first and second differential amplifiers, in response to the voltage pulses 106 and 108, there is generated at a summing junction 168 a current flow equal to the addition of the current in the transistors 112 and 130. Because of the opposite polarity of the voltage pulses 106 and 108, and the interconnection of the first and second differential amplifiers, the current addition at the summing junction 168 will be equal to the currents in both the transistors 112 and 130.

Also connected to the summing junction 168 is a transistor 196 having a base electrode connected to a drive circuit including a capacitor 198, a diode 200, and a resistor 202, all as a differentiating circuit for establishing the differentiation time for operation of the transistor 196. Also included as a part of the base drive circuit is the resistor 148. The emitter electrode of the transistor 196 is tied to a bypass capacitor 208 and to a minus DC voltage on the line 102 of the power supply 28. A current generated through the collector-emitter junction of the transistor 196 is summed at the summing junction 168 through a resistor 210.

A voltage generated at the collector electrode of the transistor 128 of the second differential amplifier is applied to the differentiating circuit for the transistor 196. By means of the differentiating circuit, the current in the collector-emitter junction of the transistor 196 follows the collector current of the transistor 128 and rapidly increases to some large positive value, as shown by the waveform 212 of FIG. 2. Capacitor 198 then causes a differentiation of the base drive current to the transistor 196 such that after several nanoseconds the current flow through the collector-emitter junction drops to zero, as shown by the curve 212, by turning off the transistor 196.

The voltage pulses 106 and 108 applied to the transistors 112 and 128 causes currents to be present in the transistors 112, 130 and 196 that are combined at the summing junction 168. The current flow through the transistor 112 is illustrated by the waveform 164, the current through the transistors 130 is illustrated by the waveform 166, and the current through the transistor 196 is illustrated by the waveform 212. These three currents are added at the summing junction 168 to produce a combined current flow through the transistor 150 as given by the waveform 214. This current flowing through the transistor 150 as shown by the waveform 214 causes the capacitor 152 to be discharged. Capacitor 152 represents the total capacitance (load and stray) on terminal 170.

Also connected to the capacitor 152 through a terminal 170 is a diode 172 as a part of a clamping circuit including a voltage source 174.

Operationally, the power supply 174 establishes a first voltage level at the diode 172 which is less than a second voltage level as appearing at the terminal 30. With the maximum current flowing through resistor 154, the voltage at the terminal 170 is at a low level and the diode 172 is back biased and nonconducting. When transistor 150 is turned off, the voltage at the terminal 170 will rise towards the voltage level at terminal 30, with a time constant given by the product of the values of resistor 154 and capacitor 152. When the voltage at the terminal 170 increases slightly above the first voltage level (a diode drop difference) established by the power supply 174, the diode 172 conducts thereby clamping the voltage at the terminal 170 and on the line 18 at the first voltage level.

Assuming the voltage at the terminal 30 is typically set at 100 volts and the first voltage level at the diode 172 is set at 45 volts, then the diode 172 clamps the voltage at the terminal 170 at one diode drop more than 45 volts. This clamping action limits the time that the capacitor 152 is charging to the rapidly increasing portion of the capacitor charge curve. This produces on the line 18 a voltage that increases from a low level to the 45 volt level in a time of a few nanoseconds.

In operation of the amplifier of the present invention and with reference to the waveform 216 of FIG. 2, at time $t_o$ the voltage signals 106 and 108 are at such a level that no current is flowing at junction 168 and transistor 150 is cut off. With transistor 150 cut off, no current is drawn through resistor 154 so that the output voltage on line 18 will be clamped by diode 172, to the level of the power supply 174. At time $t_1$, transistor 150 is turned on and by superimposing the current spike of waveform 212 on the sum of the currents through the transistors 112 and 130, the large amount of current will very rapidly discharge capacitance 152 to produce a fall time of only a few nanoseconds. The voltage at terminal 170 is now held at a low level by the conduction of transistor 150 and the non-conduction of diode 172. At time $t_2$, transistor 150 is turned off and the voltage at terminal 170 will rise toward the voltage level at terminal 30, with a time constant determined by the values of resistor 154 and capacitance 152. The charge on capacitor 152 increases very rapidly at the beginning of the charging cycle along the conventional capacitor charge curve such that the voltage at terminal 170, if capacitor 152 were allowed to charge to a steady state level, would asymtotically approach the voltage level at terminal 30. As previously explained, the voltage level at terminal 170 is clamped by diode 172 to the level of the power supply 174 (at a first level) which is less than the voltage at terminal 30 (at a second level).

Figure 4:
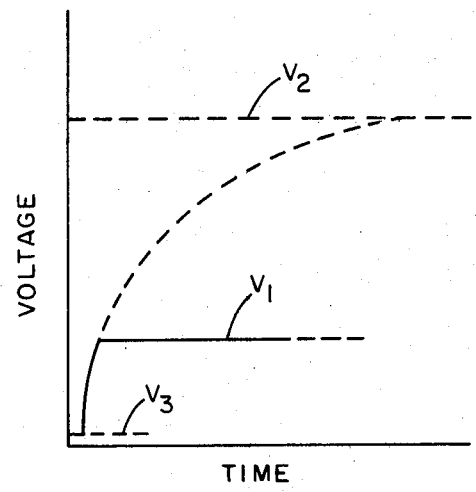
FIG. 4 shows the risetime portion of the output signal.

With reference to FIG. 4, the following is a specific example of the determination of output rise time of a switching amplifier in accordance with the present invention. FIG. 4 is not drawn to scale in order to provide clarity. $V_2$ is the voltage at terminal 30, $V_1$ is the voltage level of the power supply 174 and $V_3$ is the voltage level of terminal 170 when maximum current is flowing through resistor 154. Choosing $V_1$ equal to 45 volts, $V_2$ equal to 100 volts, resistor 154 equal to 1,000 ohms and assuming capacitor 152 equal to $10_{pf}$, the rise time of the output signal on line 18 is obtained by the following equation:

$$T_r = T \ln (E_t - E_1/E_t - E_2)$$

where $E_t = V_2 - V_3 = 95$ volts, $E_1 = 10\% (V_1 - V_3) = 4$ volts, $E_2 = 90\% (V_1 - V_3) = 36$ volts and $T = 1,000$ times $10_{pf} = 10$ nsec, the solution of the equation provides $T_r = 4.3$ nsec. The "on" current $i_1$ in FIG. 2 having been chosen to be 95 ma; therefore, $V_3 = V_2 -$ resistor $154 \times i_1 \approx 100 - 1,000 \times 0.95 = 5$ volts. In this manner, a fast risetime of the output signal is obtained.

Among the advantages of the present invention are the allowance of the use of relatively low-current transistors for transistors 112, 116, 128, 130 and 196, low dissipation for transistor 150 (0.5 watt in the preceeding example) and the use of a relatively slow and inexpensive transistor for transistor 150 due to the common base configuration.

A circuit with component values as given in the example above generated a sequence of pulses varying from 45 volts DC to 5 volts. The rise time and fall time of the leading and trailing edges of each individual pulse was approximately 8 nanoseconds.

Figure 3:
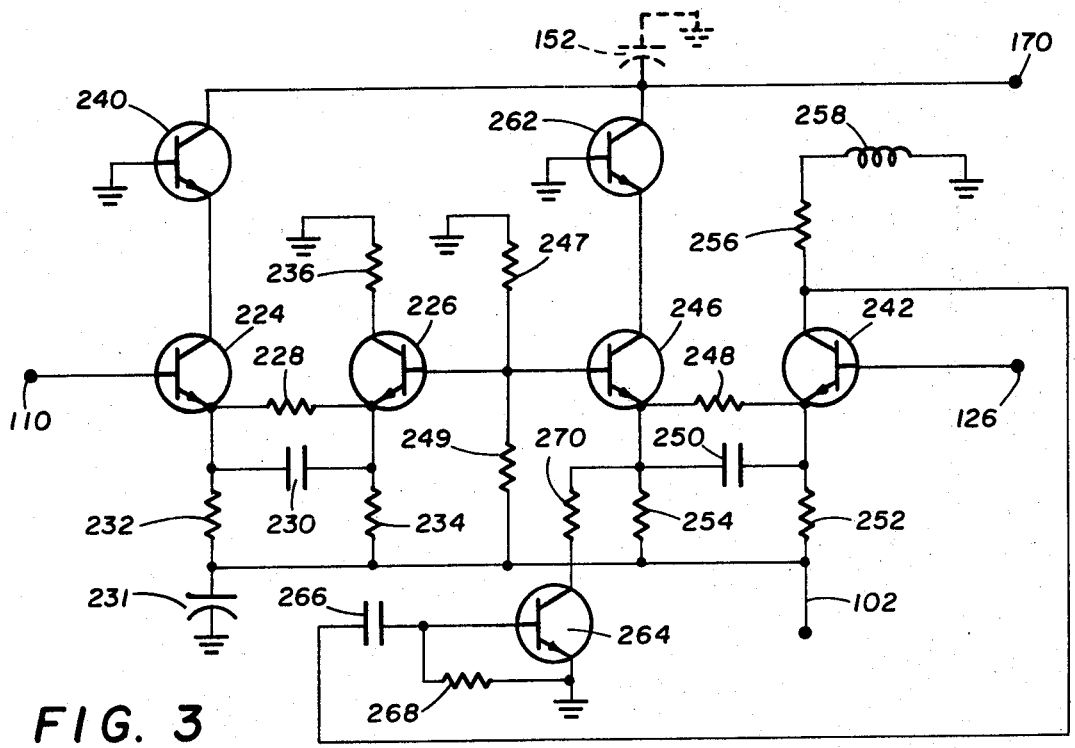
FIG. 3 is an alternate embodiment of a differential amplifier and differentiation circuit for like circuitry in the system of FIG. 1.

Referring to FIG. 3, there is shown an alternate embodiment of the first and second differential amplifiers and the differentiator, generally the circuitry within the dotted outline 220 of FIG. 1. The switching voltage pulse 106 generated at the terminal 110 is applied to the base electrode of a transistor 224 of a first differential amplifier including a transistor 226. Transistors 224 and 226 have a common emitter connection through a resistor 228 in parallel with a capacitor 230. The emitter electrodes of the transistors 224 and 226 are connected, respectively, by means of resistors 232 and 234 to the DC supply voltage on the line 102.

At the collector electrode of the transistor 224 there is connected the emitter electrode of a switching transistor 240. The transistor 240 performs essentially the same function as the transistor 150. The collector electrode of the transistor 240 connects to the terminal 170.

The switching voltage pulse of the waveform 108 is applied to the base electrode of the transistor 242 of a second differential amplifier including a transistor 246. Transistors 242 and 246 have a common emitter connection through a resistor 248 in parallel with a capacitor 250. Both the transistors 242 and 246 are interconnected to the DC voltage on the line 102 through resistors 252 and 254, respectively. At the collector electrode of the transistor 242 there is connected a resistor 256 in series with an inductor 258.

With reference to transistor 246, connected to the collector electrode is the emitter electrode of a switching transistor 262 that has a collector electrode connected to the terminal 170.

With the embodiment of FIG. 3, the transistors 240 and 262 are in a quasi parallel configuration connected to the terminal 170. In this embodiment of the invention, an increase in current flow at the terminal 170 is achievable over the embodiment of FIG. 1. This increase in current enables faster fall and rise times for the charge on capacitor 152 thus further improving the resolution of the image in the cathode ray tube. This increase in current is achievable by decreasing the value of resistor 154 in the embodiment of FIG. 3 compared to resistor 154 of the FIG. 1. This is feasible because the increased power dissipation is now shared among two transistors, 240 and 262.

To generate the current waveform 214 at the terminal 170, a differentiator including a transistor 264 is connected to the collector electrode of the transistor 242. A voltage at the collector electrode of the transistor 242 is applied to the base electrode of the transistor 264 through a differentiating network including a capacitor 266 and a resistor 268. This network applies to the base electrode of the transistor 264 the differentiated value of the voltage generated at the collector electrode of the transistor 242. Connected to the collector electrode of the transistor 264 is resistor 270 also tied to the emitter electrode of the transistor 246 of the second differential amplifier.

By operation of the transistor 264, a current in the second differential amplifier and in particular in the switching transistor 262 is modified. The differentiator of transistor 264 produces a current spike which is added to the current established by the switching voltage pulse 108 applied to the transistor 242 to generate at the terminal 170 the current waveform 214. After the differentiation time of the capacitor 266, the current at the terminal 170 settles out to the sum of the currents in the first and second differential amplifiers.

Operationally, the switching amplifier of FIG. 3 is similar to the operation of the circuit 220 of FIG. 1. The capacitor 152 is charged and discharged by operation of the transistors 240 and 262 and the voltage level at the terminal 170 is controlled by the clamping diode 172 connected to the power supply 174. As mentioned previously, with the embodiment of FIG. 3, faster fall and rise times are possible by connecting the transistors 240 and 262 in a quasi parallel configuration. This circuit was reduced to practice, and rise and fall times of approximately 3.5 nanoseconds were achieved.

While several embodiments of the invention, together with modifications thereof, have been described in detail herein and shown in the accompanying drawings, it will be evident that various further modifications are possible without departing from the scope of the invention.

What is claimed is:

1. A switching amplifier providing output pulses at a first voltage level and connected to a power supply at a second voltage level greater than the first level, comprising:

input means responsive to a switching signal and connected to the power supply for generating a first output current, a differentiator coupled to said input means and to the power supply and responsive to the switching signal for generating a second output current, a summing junction for adding the first and second output currents, and clamping means connected to said summing junction for limiting the amplitude of the output pulses to the first voltage level.

2. A switching amplifier providing output pulses as set forth in claim 1 wherein said summing junction includes inherent capacitance associated therewith, which is discharged at a rate controlled by the first and second output currents.

3. A switching amplifier providing output pulses at a first voltage level as set forth in claim 2 including a load resistor connected between the power supply and said summing junction for charging said inherent capacitance from the power supply.

4. A switching amplifier providing output pulses as set forth in claim 1 wherein said clamping means comprises a diode biased to conduct at a first voltage level.

5. A switching amplifier providing output pulses as set forth in claim 1 wherein said summing junction includes an output transistor connected between the power supply and said input means and said differentiator for controlling the first and second output currents.

6. A switching amplifier providing output pulses at a first voltage level and connected to a power supply at a second voltage level greater than the first level, comprising:
a first differential amplifier responsive to a first switching signal and connected to the power supply for generating a first output current,
a second differential amplifier responsive to a second switching signal and connected to the power supply for generating a second output current,
a differentiator coupled to said second differential amplifier and to the power supply and responsive to a signal from said second differential amplifier for generating a third output current,
a summing junction for adding the first, second and third output currents, and
clamping means connected to said summing junction for limiting the amplitude of the output pulses to the first voltage level.

7. A switching amplifier providing output pulses as set forth in claim 6 wherein said summing junction includes inherent capacitance associated therewith, which is discharged at a rate controlled by the first, second and third output currents.

8. A switching amplifier providing output pulses at a first voltage level as set forth in claim 7 including a load resistor connected between the power supply and said summing junction for charging said inherent capacitance from the power supply.

9. A switching amplifier providing output pulses as set forth in claim 6 wherein said summing junction includes a first output transistor coupled to the first differential amplifier for controlling the first output current, and a second output transistor connected to the second differential amplifier for controlling the second output current.

10. A switching amplifier providing output pulses as set forth in claim 9 including means for interconnecting said first and second output transistors to said clamping means.

11. A switching amplifier providing output pulses as set forth in claim 10 wherein said clamping means includes a diode connected to said interconnecting means and biased to conduct at the first voltage level.

12. A switching amplifier providing output pulses as set forth in claim 6 wherein said first and second differential amplifiers generate square waveform output pulses and said differentiator includes means interconnected to said second differential amplifier for differentiating the leading edge of the second output current pulse into a current spike.

13. A switching amplifier providing output pulses as set forth in claim 12 wherein said differentiator includes means for limiting the time duration of the current spike to a desired rise time of the output pulses.

14. A switching amplifier providing output pulses at a first voltage level and connected to a power supply at a second voltage level greater than the first level, comprising:
a first differential amplifier having first and second interconnected transistors and generating a first output current, one of said transistors responsive to a switching signal,
a second differential amplifier having first and second transistors and generating a second output current, the first transistor responsive to a second switching signal,
a differentiator connected to a transistor of said second differential amplifier and providing a control signal to the first and second transistors thereof,
a summing junction for adding the first and second output currents, and
clamping means connected to said summing junction for limiting the amplitude of the output pulses to the first voltage level.

15. A switching amplifier providing output pulses as set forth in claim 14 wherein said summing junction includes inherent capacitance associated therewith, which is discharged at a rate controlled by the first, second, and third output currents.

16. A switching amplifier providing output pulses at a first voltage level as set forth in claim 15 including a load resistor connected between the power supply and said summing junction for charging said inherent capacitance from the power supply.

17. A switching amplifier providing output pulses as set forth in claim 16 wherein said summing junction includes an output transistor connected to said first and second differential amplifiers and the power supply for controlling the first and second output currents.

18. A switching amplifier providing output pulses as set forth in claim 14 wherein said summing junction includes a first output transistor interconnected between the power supply and said first differential amplifier for controlling the first output current, and a second output transistor interconnected between the power supply and said second differential amplifier for controlling the second output current.

19. A switching amplifier providing output pulses as set forth in claim 18 including means for interconnecting said first and second output transistors, and said clamping means includes a diode connected to said means for interconnecting and biased to conduct at the first voltage level.

20. A switching amplifier providing output pulses as set forth in claim 14 wherein the first and second transistors of said second differential amplifier have a common emitter connection, and said differentiator includes means connected to the emitter electrodes of the first and second transistors for controlling the second output current.

* * * * *